United States Patent [19]

Fowler et al.

[11] Patent Number: 5,796,256

[45] Date of Patent: Aug. 18, 1998

[54] ESD SENSOR AND METHOD OF USE

[75] Inventors: Clifford M. Fowler, Phoenix; William V. Duncan, Scottsdale, both of Ariz.

[73] Assignee: Motorola, Inc., Schaumburg, Ill.

[21] Appl. No.: 634,600

[22] Filed: Apr. 24, 1996

[51] Int. Cl.⁶ .......................... G01N 27/60; G01R 31/26
[52] U.S. Cl. ....................... 324/456; 324/72; 340/650
[58] Field of Search ........................... 324/452, 456, 324/525, 536, 763, 556, 557, 719, 722, 72; 340/635, 662, 650, 653

[56] References Cited

U.S. PATENT DOCUMENTS

| | | | |
|---|---|---|---|
| 4,823,088 | 4/1989 | Fukuda | 324/452 X |
| 5,359,319 | 10/1994 | Campbell et al. | 340/650 X |
| 5,376,879 | 12/1994 | Schrimpf et al. | 324/456 X |

*Primary Examiner*—Michael Brock
*Attorney, Agent, or Firm*—Eugene A. Parsons

[57] ABSTRACT

An ESD sensor includes a plurality of layers of dielectric material positioned on a substrate, each having a different thickness, a first contact positioned adjacent each of the plurality of layers and a plurality of second contacts, one each positioned on each layer of the plurality of layers of dielectric material. Each different thickness of each individual layer of dielectric material is formed to provide a specific voltage at which an electrical short will occur between the first and second contacts when an ESD appears thereacross, so that the sensor provides an indication of a range of voltages.

20 Claims, 3 Drawing Sheets

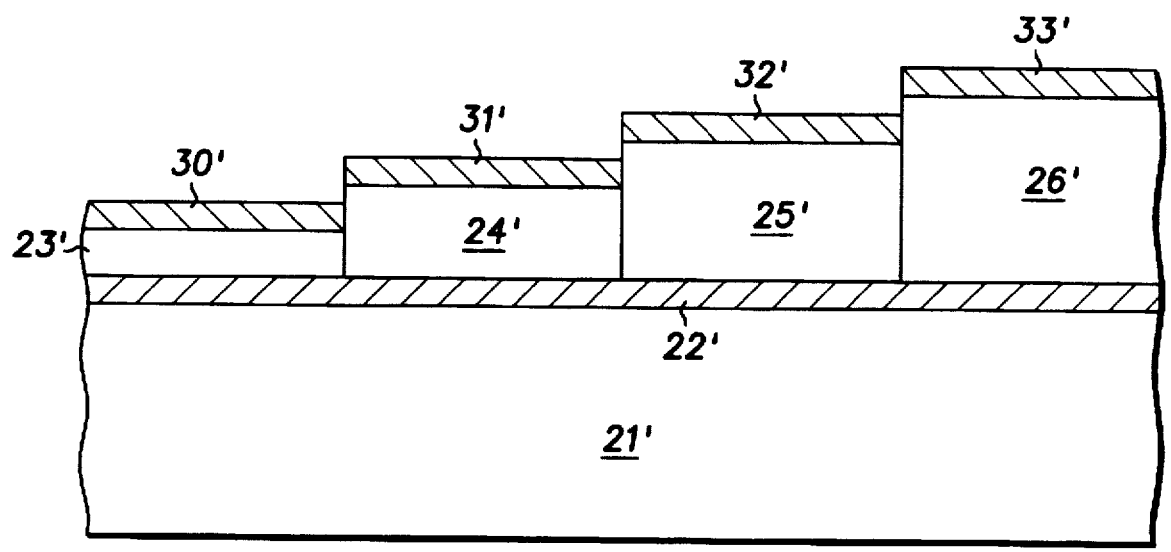
FIG. 5 20'

ESD SENSOR AND METHOD OF USE

FIELD OF THE INVENTION

The present invention pertains to the sensing of electrostatic discharges to or from electronic circuits and recording the occurrence and magnitude of the event.

BACKGROUND OF THE INVENTION

One of the most significant problems in the semiconductor industry is the deleterious effects upon electronic devices or circuitry from electrostatic discharge (ESD). Conductors can be charged by conduction (contacting another conductor that is charged), or by induction (being exposed to the field emitted by a charged object). Conductors or insulators can be charged by triboelectrification (contact with and separation from other materials). Depending upon the circumstances, the magnitude of such charges range from a few volts to tens of thousands of volts. The threshold of damage from ESD events for some devices and circuitry is less than one hundred volts. Such "damage" can range from momentary upset or reset to performance degradation or catastrophic failure. To minimize these effects, most semiconductor fabrication and system assembly facilities implement a variety of relatively expensive controls. These include static dissipative garments and work surfaces, personal grounding mechanisms such as wrist straps, or footwear with conductive flooring. Additional controls take the form of air ionization and/or humidity control. Special packaging and containers are used for storage or transport of ESD sensitive items. Where electrical performance requirements permit, special additional circuitry is included in devices and/or systems to protect their more sensitive elements. All of these controls add substantial cost to the end product and to transporting it to the customer.

However, even with all of the precautions utilized in the semiconductor industry, ESD events still occur and cause substantial amounts of damage. Some estimates have indicated that as much as 70% of returns from customers are due to damage from ESD. In addition to the obvious costs in money and time, the negative impact upon customer satisfaction and therefore future business is intolerable.

Accordingly, it would be highly advantageous to be able to detect when and how an ESD event occurs so that corrective action can be implemented to inhibit recurrence.

It is a purpose of the present invention to provide a new and improved ESD sensor.

It is another purpose of the present invention to provide a new and improved ESD sensor which is extremely small, inexpensive and simple to fabricate.

It is still another purpose of the present invention to provide a new and improved ESD sensor and method of use which provides a clear indication of an ESD event.

It is a further purpose of the present invention to provide a new and improved ESD sensor which is capable of indicating various characteristics of an ESD event, such as the amplitude of the voltage.

It is yet another purpose of the present invention to provide a new and improved ESD sensor that, when included with ESD sensitive items and monitored after sequential operations, the operational step at which an ESD event occurs can be identified.

It is an additional purpose of the present invention to provide a new and improved ESD sensor that, when used in conjunction with a clock/calendar device, the exact time at which an ESD event occurs can be recorded.

SUMMARY OF THE INVENTION

The above problems and others are at least partially solved and the above purposes and others are realized in an ESD sensor which includes at least one layer of dielectric material with a first contact positioned adjacent one side of the layer and a second contact positioned on a second side of the layer of dielectric material. The sensor is positioned to receive electrostatic discharges which appear across electrical circuits to be monitored. By testing the sensor for electrical shorts information can be determined as to the electrostatic discharges which appeared across the electrical circuit.

In a specific example, a plurality of layers of dielectric material are positioned on a substrate containing an electrical circuit to be monitored. Each of the layers of dielectric material has a different thickness. A first contact is positioned adjacent each of the plurality of layers and a plurality of second contacts are positioned, one each on each layer of the plurality of layers of dielectric material. Each different thickness of each individual layer of dielectric material is formed to provide a specific voltage at which an electrical short will occur between the first and second contacts when an ESD appears thereacross, so that the sensor provides an indication of a range of voltages.

BRIEF DESCRIPTION OF THE DRAWINGS

Referring to the drawings:

FIG. 5 is an enlarged sectional view of another embodiment of an ESD sensor in accordance with the present invention.

DESCRIPTION OF THE PREFERRED EMBODIMENTS

Figure 1:
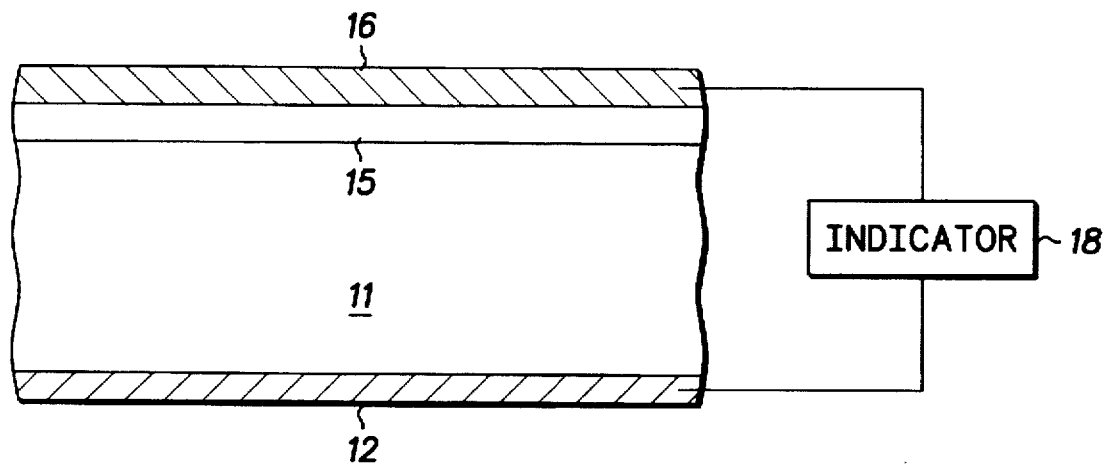
FIG. 1 is an enlarged sectional view of an ESD sensor in accordance with the present invention.

Turning now to the figures wherein several embodiments of ESD sensors in accordance with the present invention are illustrated, a first ESD sensor 10 is illustrated in FIG. 1. Sensor 10 includes a substrate 11, which is a semiconductor chip in this specific example. At least the portion of substrate 11 which is illustrated is doped so as to provide some electrical conduction. A first electrical contact 12 for sensor 10 is positioned on the lower side of substrate 11. In this embodiment contact 12 is a layer of metal, such as gold, or other good conductors, which is deposited on the rear or lower surface of substrate 10 by any of the known methods.

A layer 15 of dielectric material is positioned on the upper surface of substrate 10. With substrate 10 being a semiconductor chip such as silicon, layer 15 can be a layer of silicon dioxide ($SiO_2$) which can be easily formed by oxidizing the surface of substrate 10 utilizing any of the well known semiconductor processes. A second electrical contact 16 is positioned on the upper surface of dielectric layer 15. Electrical contact 16 forms a second contact for sensor 10 and may be formed by depositing any convenient metal on the surface, such as aluminum, utilizing standard semiconductor processes.

Sensor 10 can be formed as a discrete component on a separate semiconductor chip and connected to sensing circuits or it can be formed on any portion of any integrated circuit or the like which it is desired to monitor for ESD events. By forming sensor 10 as described above, it can be fabricated very inexpensively and requires very little substrate surface. Generally, a typical sensor 10 will be 20×30 mils square and no more than a few thousand angstroms thick. Also, while a silicon device is illustrated herein for purposes of this explanation, it will be understood that other semiconductor materials could also be utilized, such as silicon carbide, gallium arsenide, etc.

In operation, sensor 10 is conveniently positioned to receive ESDs which would appear, for example, across an electrical circuit to be monitored. When the peak voltage, or the energy level, of an ESD event exceeds the voltage which dielectric layer 15 is capable of withstanding, the dielectric (silicon oxide in this example) between substrate 11 and electrical contact 16 (aluminum in this example) breaks down and an aluminum silicide path is created between substrate 11 and electrical contact 16. The aluminum silicide path is a direct electrical short circuit which remains in dielectric layer 15 and may be found at any time subsequent to the ESD event.

The state of dielectric layer 15 can be periodically checked with an electrical circuit to determine whether dielectric layer 15 has been ruptured, or electrically shorted, by the application of an over-voltage thereto (e.g. an ESD event), or it can be monitored continuously by connecting an indicator 18 between electrical contacts 12 and 16, as illustrated in FIG. 1. Indicator 18 can be as simple as a light emitting device, such as a light emitting diode (organic or inorganic), an LCD, etc. or it can be a clock-calendar device to record the exact time and date that the electrical short or ESD event, occurred.

Figure 2:
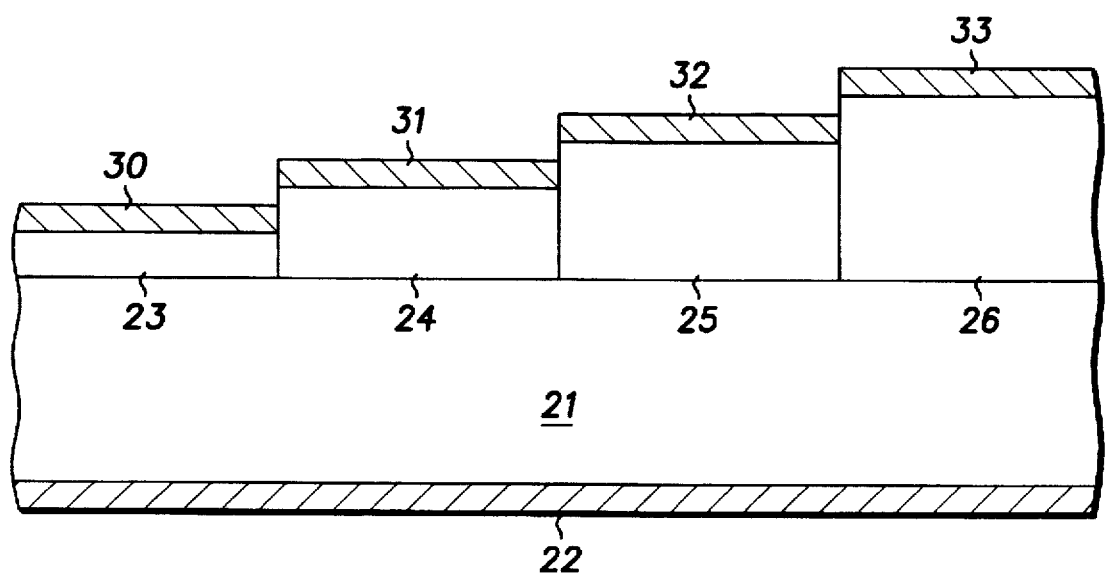
FIG. 2 is an enlarged sectional view of another embodiment of an ESD sensor in accordance with the present invention.

Referring specifically to FIG. 2, an embodiment of an ESD sensor 20 is illustrated in which a plurality of sensor devices are combined. Sensor 20 includes a substrate 21 having a first electrical contact 22 positioned on the lower surface thereof and a plurality of layers 23 through 26 positioned on the upper surface thereof. Each of the layers 23 through 26 is formed with a different thickness of the dielectric material so that each of the layers 23 through 26 can withstand a different amount of electrical energy or voltage thereacross and, therefore, requires a different amount of voltage to cause a short circuit therethrough. By carefully controlling the thicknesses of dielectric layers 23 through 26, the threshold voltage level at which an ESD event would be detected can be predetermined. The conductance (reciprocal of resistance) of the path through the dielectric layer indicates the approximate energy level of the ESD event.

To complete sensor 20, a plurality of second electrical contacts 30 through 33 are positioned, one each, on each layer 23 through 26 of dielectric material. While each of the various layers 23 through 26 are illustrated in juxtaposition, it will be understood that the layers can be positioned in any way that is convenient for the particular materials and methods of fabrication. Also, while a single contact 22 is illustrated it will be understood that this contact is generally some common connection, such as ground or the like.

Figure 3:
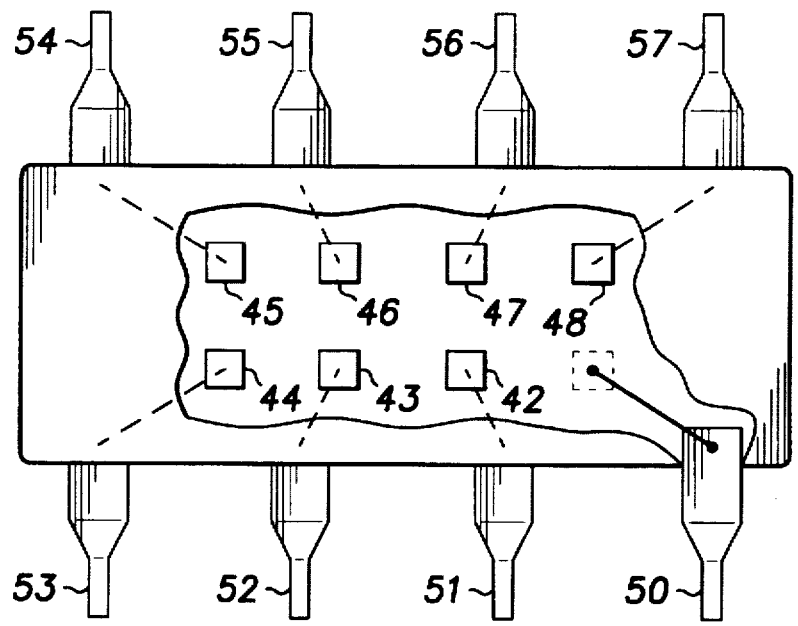
FIG. 3 is a view in top plan of another ESD sensor in accordance with the present invention.

A specific example of an ESD sensor circuit 40 in accordance with the present invention, is illustrated in FIG. 3. Sensor circuit 40 is somewhat similar to sensor 20 of FIG. 2 in that a plurality of different individual sensors 42 through 48 are fabricated on a single substrate or support. Each sensor 42 through 48 includes a dielectric layer with a different thickness specifically selected and formed to withstand a different threshold voltage. Further, a first or common contact is positioned adjacent the lower surface of each of the sensors 42 through 48 and a connection, which in this example is a wire bond, is made to an external pin 50. A plurality of second electrical contacts, one each positioned on each layer of the plurality of layers of dielectric material are formed to complete each sensor 42 through 48. An electrical connection (in this example a wire bond) is completed from the second electrical contact of each individual sensor 42 through 48 to a different external pin 51 through 57, respectively.

Each different thickness of each individual layer of the plurality of layers of dielectric material in sensors 42 through 48 is formed to provide a specific voltage at which an electrical short will occur between the first electrical contact 50 and the second electrical contact 51 through 57 positioned on the individual layer, so that sensor circuit 40 provides an indication of a range of voltages. In this specific example: sensor 42 has a threshold voltage of 50 volts, sensor 43 has a threshold voltage of 100 volts, sensor 44 has a threshold voltage of 200 volts, sensor 45 has a threshold voltage of 300 volts, sensor 46 has a threshold voltage of 500 volts, sensor 47 has a threshold voltage of 1000 volts, and sensor 48 has a threshold voltage of 2000 volts. Thus, by determining which sensors have been shorted by an overvoltage, an approximation of the ESD or other voltage that caused the electrical short can be determined.

It should also be noted that in this example sensor circuit 40 is fabricated in a DIP pack age so that it can easily be incorporated into virtually any standard electrical circuit. Further, sensor circuit 40 can be included as a component in standard shipping packages, such as the well known plastic tubes, trays, etc. Thus, sensor circuit 40 is used to track components through assembly and shipping to determine any specific areas where ESD events are occurring once the position of the ESD events is determined a resolution to the problem can generally be relatively easily achieved.

Figure 4:
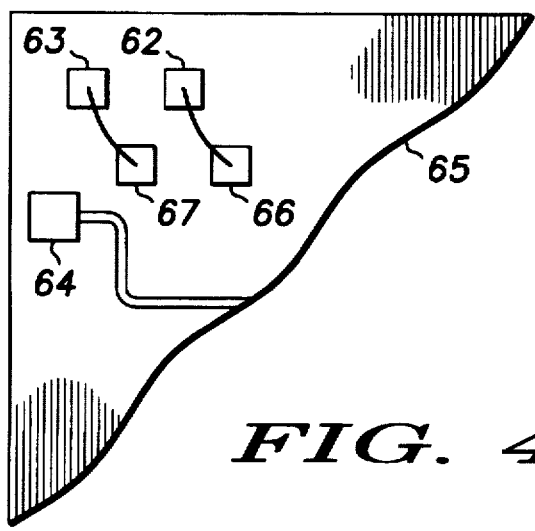
FIG. 4 is a view in top plan, portions thereof broken away, of an electrical circuit including an ESD sensor in accordance with the present invention.

Referring now to FIG. 4 a portion of an electrical circuit 60 is illustrated, which electrical circuit 60 can be an integrated circuit, a circuit formed on a printed circuit board, etc. Electrical circuit 60 includes a plurality of bonding pads 62, 63, and 64 positioned around the periphery of a substrate 65. Generally, electrical circuits have some additional unused bonding pads, which in this example are illustrated as bonding pads 62 and 63. To incorporate ESD sensors into electrical circuit 60, a plurality of individual sensors 66 and 67 are formed on substrate 65 and one contact of each is connected to separate bonding pads 62 and 63, respectively. A common contact for sensors 66 and 67 is connected to a common contact for electrical circuit 60, such as ground.

In this specific example, integrated or electrical circuit 60 includes a signal input, which may be for example bonding pad 64, having a known input capacitance. To match sensors 66 and 67 to electrical circuit 60 the layer of dielectric material and the second contact are formed with an area such that a capacitance formed therebetween is approximately the same size as the input capacitance of the signal input of the integrated circuit. Thus, bonding pads 62 and 63 will appear to an ESD event the same as input terminal 64 of the integrated circuit and the ESD event will have virtually the same effect on sensors 62 and 63 as it does on electrical circuit 60. By including a plurality of sensors on the same substrate as the integrated circuit, a good approximation of ESD events that occur can be recorded.

Referring now to FIG. 5 an enlarged sectional view of another embodiment of an ESD sensor 20' in accordance with the present invention is illustrated. The embodiment of FIG. 5 is similar to the embodiment illustrated in FIG. 2 and similar components are designated with similar numbers having a prime added to indicate the different embodiment. Sensor 20' includes a substrate 21' having a first electrical contact 22' positioned on the upper surface of contact 22' and a plurality of layers 23' through 26' positioned on the upper surface of contact 22'. Each of the layers 23' through 26' is formed with a different thickness of the dielectric material. To complete sensor 20', a plurality of second electrical contacts 30' through 33' are positioned, one each, on each layer 23' through 26' of dielectric material. While each of the various layers 23' through 26' are illustrated in juxtaposition, it will be understood that the layers can be positioned in any way that is convenient for the particular materials and methods of fabrication. Also, while a single contact 22' is illustrated it will be understood that this contact is generally some common connection, such as ground or the like.

Thus, ESD sensors and methods to monitor semiconductor components to determine when and/or how electrostatic discharges occurred is provided so that special precautions can be taken. In addition to the above, ESD sensors can be made in wafer form so that ESD events can be tracked through a fabrication facility, all the way to saw or scribe stations. Also, the ESD sensor can be provided in discrete form to monitor ESD events in packaging and shipping. Further, ESD sensors can be added to most circuit boards and integrated circuits (early) to track major assembly operations. In all of these situations, if the ESD sensors remain as a permanent part of the system, they can be used to detect exposure to ESD events during system repair activities and other post fabrication activities.

Thus, a new and improved ESD sensor is disclosed which is extremely small, inexpensive and simple to fabricate. Also, the new and improved ESD sensor and method of use provide a clear indication of an ESD event and is capable of indicating various characteristics of an ESD event, such as the size of the voltage as well as the exact time and date.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. An electrostatic discharge sensor comprising:
   a semiconductor substrate having first and second opposed major surfaces, and including an integrated circuit formed thereon, the integrated circuit including a signal input having an input capacitance;
   a layer of dielectric material on the first major surface of the substrate;
   a first electrical contact on the second major surface of the substrate;
   a second electrical contact on the layer of dielectric material; and
   the layer of dielectric material having a thickness selected such that a specific electrostatic discharge voltage will produce an electrical short between the first and second electrical contacts and the layer of dielectric material and the second electrical contact being formed with an area such that a capacitance formed therebetween is approximately the same size as the input capacitance of the signal input of the integrated circuit.

2. An electrostatic discharge sensor as claimed in claim 1 wherein the substrate is silicon and the layer of dielectric material is silicon dioxide grown on the surface thereof.

3. An electrostatic discharge sensor as claimed in claim 2 wherein the second electrical contact is a layer of aluminum deposited on the silicon dioxide.

4. An electrostatic discharge sensor as claimed in claim 1 including in addition an indicator having two activating terminals, one each of the two activating terminals being connected to one each of the first and the second electrical contacts.

5. An electrostatic discharge sensor as claimed in claim 4 wherein the indicator includes a light emitting device.

6. An electrostatic discharge sensor comprising:
   a semiconductor substrate having first and second opposed major surfaces,
   a plurality of layers of dielectric material each positioned on the first major surface of the substrate, each layer of the plurality of layers having a different thickness;
   a first electrical contact positioned on the second major surface of the substrate; and
   a plurality of second electrical contacts, one each positioned on each layer of the plurality of layers of dielectric material.

7. An electrostatic discharge sensor as claimed in claim 6 wherein each different thickness of each individual layer of the plurality of layers of dielectric material is formed to provide a specific voltage at which an electrical short will occur between the second electrical contact positioned on the individual layer and the first electrical contact, so that the sensor provides an indication of a range of voltages.

8. An electrostatic discharge sensor as claimed in claim 6 including in addition an indicator having two activating terminals, one each of the two activating terminals being connected to one each of the first and at least one of the plurality of second electrical contacts.

9. An electrostatic discharge sensor as claimed in claim 8 wherein the indicator includes a light emitting device.

10. An electrostatic discharge sensor as claimed in claim 8 wherein the indicator includes a timing device connected to indicate a time at which a short occurs between the first and the second electrical contacts.

11. An electrostatic discharge sensor comprising:
    a plurality of layers of dielectric material each positioned on a substrate, each layer of the plurality of layers having a different thickness;
    a first electrical contact positioned adjacent and electrically connected to a first major surface of each of the plurality of layers of dielectric material; and
    a plurality of second electrical contacts, one each positioned on each layer of the plurality of layers of dielectric material.

12. An electrostatic discharge sensor as claimed in claim 11 wherein each different thickness of each individual layer of the plurality of layers of dielectric material is formed to provide a specific voltage at which an electrical short will occur between the second electrical contact positioned on the individual layer and the first electrical contact, so that the sensor provides an indication of a range of voltages.

13. A method of sensing characteristics of an electrostatic discharge in an electrical circuit comprising the steps of:
    providing an electrical circuit including a substrate having first and second opposed major surfaces,
    positioning a plurality of sensors on the substrate including the steps of forming a plurality of layers of dielectric material with different thicknesses each being positioned on the first major surface of the substrate, positioning a first electrical contact on the second major surface of the substrate, and positioning a second electrical contact on each layer of the plurality of layers of dielectric material; and testing each sensor of the plurality of sensors to determine which sensor of the plurality of sensors has an electrical short.

14. A method of sensing characteristics of an electrostatic discharge in an electrical circuit as claimed in claim 13 wherein the step of forming the plurality of layers of dielectric material with different thicknesses includes forming the different thicknesses to provide a specific voltage at which an electrical short will occur between the second electrical contact positioned on the individual layer and the first electrical contact, so that the plurality of sensors provide an indication of a range of voltages.

15. A method of sensing characteristics of an electrostatic discharge in an electrical circuit comprising the steps of:

providing an electrical circuit including a substrate;

positioning a plurality of sensors on the substrate including the steps of forming a plurality of sections of dielectric material with different thicknesses and positioning a first electrical contact adjacent and electrically connected to one side of each of the plurality of sections of dielectric material and positioning a plurality of second electrical contacts, one each adjacent and electrically connected to a second side of each section of the plurality of sections of dielectric material; and testing each sensor of the plurality of sensors to determine which sensor of the plurality of sensors has an electrical short.

16. A method of sensing characteristics of an electrostatic discharge in an electrical circuit as claimed in claim 15 wherein the step of forming the plurality of layers of dielectric material with different thicknesses includes forming the different thicknesses to provide a specific voltage at which an electrical short will occur between the second electrical contact positioned on the individual layer and the first electrical contact, so that the plurality of sensors provide an indication of a range of voltages.

17. A method of sensing characteristics of an electrostatic discharge in an electrical circuit as claimed in claim 15 wherein the step of testing each of the sensors includes providing an indicator having two activating terminals, and connecting one each of the two activating terminals to one each of the first and at least one of the plurality of second electrical contacts.

18. A method of sensing characteristics of an electrostatic discharge in an electrical circuit as claimed in claim 17 wherein the step of providing an indicator includes providing a light emitting device.

19. A method of sensing characteristics of an electrostatic discharge in an electrical circuit as claimed in claim 17 wherein the step of providing an indicator includes providing a timing device and connecting the timing device to the plurality of sensors to indicate a time at which a short occurs between the first and the second electrical contacts.

20. An electrostatic discharge sensor comprising:

a semiconductor substrate having first and second opposed major surfaces;

a layer of dielectric material on the first major surface of the substrate;

a first electrical contact on the second major surface of the substrate;

a second electrical contact on the layer of dielectric material;

the layer of dielectric material having a thickness selected such that a specific electrostatic discharge voltage will produce an electrical short between the first and second electrical contacts; and an indicator having two activating terminals, one each of the two activating terminals being connected to one each of the first and the second electrical contacts, the indicator including a timing device connected to indicate a time at which a short occurs between the first and the second electrical contacts.

* * * * *